United States Patent [19]

Lewandowski et al.

[11] Patent Number: 4,633,429

[45] Date of Patent: Dec. 30, 1986

[54] PARTIAL MEMORY SELECTION USING A PROGRAMMABLE DECODER

[75] Inventors: Alan J. Lewandowski; Jerry D. Moench, both of Austin, Tex.

[73] Assignee: Motorola, Inc., Schaumburg, Ill.

[21] Appl. No.: 453,008

[22] Filed: Dec. 27, 1982

[51] Int. Cl.[4] .................. G11C 17/00; G11C 13/00
[52] U.S. Cl. ................................. 365/96; 365/189; 365/230
[58] Field of Search ............... 364/200, 900; 365/189, 365/200, 96, 203, 230

[56] References Cited

U.S. PATENT DOCUMENTS

| | | | |
|---|---|---|---|
| 3,872,450 | 3/1975 | Reynolds | 365/96 |
| 4,101,974 | 7/1978 | Immer et al. | 365/96 |
| 4,365,319 | 12/1982 | Takemae | 365/200 |
| 4,392,211 | 7/1983 | Nakano et al. | 365/200 |
| 4,441,167 | 4/1984 | Principi | 365/96 |
| 4,477,739 | 10/1984 | Proebsting et al. | 365/230 |
| 4,488,266 | 12/1984 | Spence | 365/189 |
| 4,532,607 | 7/1985 | Uchida | 365/96 |
| 4,539,658 | 9/1985 | Shimohigashi et al. | 365/203 |
| 4,542,485 | 9/1985 | Iwahashi et al. | 365/189 |

*Primary Examiner*—Gareth D. Shaw
*Assistant Examiner*—Daniel K. Dorsey
*Attorney, Agent, or Firm*—John A. Fisher; Jeffrey Van Myers; James L. Clingan, Jr.

[57] ABSTRACT

A technique for providing a partial memory of one half of the possible storage bits comprised of any two quadrants is implemented by decoupling the one of four decoder used for normal operation and providing a programmable decoder which is capable of being programmed to select one of any two quadrants. If only one quadrant is to form the partial memory, the programmable decoder can be programmed to select only one latch. In another embodiment, a decoder is provided which can also be programmed to select one of any three quadrants.

11 Claims, 2 Drawing Figures

PARTIAL MEMORY SELECTION USING A PROGRAMMABLE DECODER

BACKGROUND OF THE INVENTION

This invention relates to memories which are partially good, and more particularly to memories which use an array division technique for providing a memory which is partially good.

Memories, having a fabricated number of memory elements, are sometimes sold as having only half of the fabricated number of memory elements being good. The purpose for doing so is to get some value from a part that would otherwise be unmarketable. A technique for array division disclosed in U.S. patent application No. 305,830, Memory with Permanent Array Division Capability, Kuo, overcomes requiring a response from the user, such as, applying either a positive or a negative power supply voltage to an address pin. This was achieved by programming an address buffer to apply a particular address signal at only one logic level so that only a memory cell in the half of the array corresponding to that logic level could be selected.

For a memory with four quadrants, a logic high could correspond to a first and a second quadrant, and a logic low could correspond to a third and a fourth quadrant. In such a case a half good memory can be obtained only if both the first and second quadrants are good or both the third and fourth quadrants are good. Other combinations of two good quadrants, e.g., first and third, first and fourth, second and third, and second and fourth, could not be utilized to obtain a half good memory, however.

SUMMARY OF THE INVENTION

An object of the instant invention is to provide a memory with improved partial memory capability.

Another object of the invention is to provide a partial memory selectable from any of the good quadrants of a memory array.

Yet another object of the invention is to provide a programmable decoder for selecting data from any of the good quadrants of a memory array.

These and other objects of the invention are achieved by a memory having a plurality of memory array portions. A first decoder is used when all of the array portions are functional. The first decoder is capable of being disabled when at least one of the array portions is non-functional. A second decoder is enabled and used when at least one of the array portions is non-functional.

BRIEF DESCRIPTION OF THE DRAWINGS

Shown in FIG. 1 is a portion of a memory with partial memory selection circuitry according to a preferred embodiment of the invention.

Shown in FIG. 2 is a programmable decoder according to another embodiment of the invention.

DESCRIPTION OF THE DRAWINGS

Figure 1:
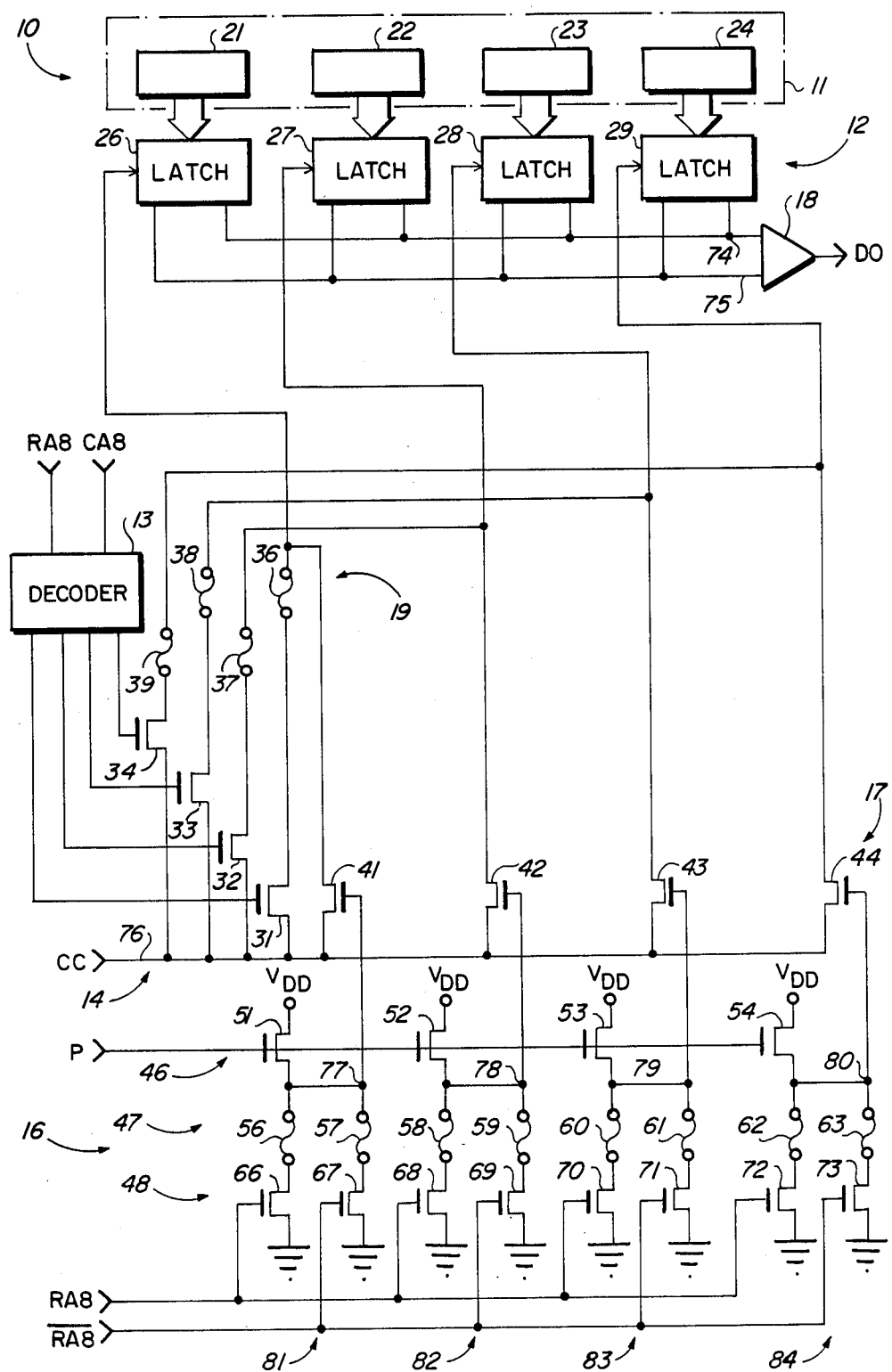

Shown in FIG. 1 is a portion of a memory 10 comprised generally of a memory array 11, a plurality of data latches 12, a normal decoder 13, a plurality of normal-decoder coupling transistors 14, a programmable decoder 16, a plurality of programmable-decoder coupling transistors 17, an output latch 18 which also serves as an output buffer, and a plurality of fusible links 19. Memory array 11 is illustrated as having a first quadrant 21, a second quadrant 22, a third quadrant 23 and a fourth quadrant 24. Plurality of coupling transistors 14 comprises transistors 31, 32, 33 and 34. Plurality of fusible links 19 comprises fusible links 36, 37, 38 and 39. Plurality of transistors 17 comprises transistors 41, 42, 43 and 44. Programmable decoder 16 is comprised generally of a plurality of precharge transistors 46, a plurality of fusible links 47, and a plurality of decoder transistors 48. Plurality of transistors 46 comprises transistors 51, 52, 53 and 54. Plurality of fusible links 47 comprises fusible links 56, 57, 58, 59, 60, 61, 62 and 63. Plurality of transistors 48 comprises transistors 66, 67, 68, 69, 70, 71, 72 and 73. Each transistor described herein is an enhancement mode N channel insulated gate FET having a gate, drain, and a source and a threshold voltage of 0.5 to 1.0 volt.

Latch 26 receives and stores a data bit from quadrant 21. Latch 27 receives and stores a data bit from quadrant 22. Latch 28 receives and stores a data bit from quadrant 23. Latch 29 receives and stores a data bit from quadrant 24. Latch 26 has a true output connected to a true data line 74, a complementary output connected to a complementary data line 75, and a clock input. Latches 27–29 also each have a true output connected to line 74, a complementary output connected to line 75, and a clock input. Output latch 18 has a true input connected to line 74, a complementary input connected to line 75, and an output for providing output signal DO. Decoder 13 receives signals RA8 and CA8. Decoder 13 has four outputs coupled to plurality of transistors 14. Transistor 31 has a gate connected to the first output of decoder 13, a drain connected to a line 76, and a source. Transistor 32 has a gate connected to the second output of decoder 13, a drain connected to line 76, and a source. Transistor 33 has a gate connected to the third output of decoder 13, a drain connected to line 76, and a source. Transistor 34 has a gate connected to the fourth output of decoder 13, a drain connected to line 76, and a source. Decoder 13 is coupled to plurality of output latches 12 via plurality of transistors 14 and plurality of fusible links 19. Fusible link 36 is connected between the source of transistor 31 and the clock input of latch 26. Fusible link 37 is connected between the source of transistor 32 and the clock input of latch 27. Fusible link 38 is connected between the source of transistor 33 and the clock input of latch 28. Fusible link 39 is connected between the source of transistor 34 and the clock input of latch 29.

Programmable decoder 16 is coupled to plurality of data latches 12 via plurality of transistors 17. Transistor 41 has a drain connected to line 76, a source connected to the clock input of latch 26, and a gate connected to a node 77. Transistor 42 has a drain connected to line 76, a source connected to the clock input of latch 27, and a gate connected to a node 78. Transistor 43 has a drain connected to line 76, a source connected to the clock input of latch 28, and a gate connected to a node 79. Transistor 44 has a drain connected to line 76, a source connected to the clock input of latch 29, and a gate connected to a node 80. Transistors 51–54 each have a gate for receiving a precharge signal P and a drain connected to a positive power supply voltage terminal $V_{DD}$ for receiving a positive power supply voltage, for example, 5 volts. Transistor 51 has a source connected to node 77. Transistor 52 has a source connected to node 78. Transistor 53 has a source connected to node 79. Transistor 54 has a source connected to node 80. Transistors 66–73 each have a source connected to a negative power supply terminal for receiving current, for example, ground. Transistors 66, 68, 70 and 72 each have a gate for receiving a row address signal RA8. Transistors 67, 69, 71 and 73 each have a gate for receiving complementary row address signal $\overline{RA8}$. Transistors 66–73 each have a drain. Plurality of fusible links 47 are connected between plurality of transistors 17 and plurality of transistors 48. Fusible links 56–63 each are connected between the drain of a corresponding one of transistors 66–73 and a corresponding one of nodes 77–80. Fusible link 56, fusible link 57, fusible link 58, fusible link 59, fusible link 60, fusible link 61, fusible link 62 and fusible link 63 correspond to transistor 66, transistor 67, transistor 68, transistor 69, transistor 70, transistor 71, transistor 72 and transistor 73, respectively. Node 77 corresponds to fusible links 56 and 57. Node 78 corresponds to fusible links 58 and 59. Node 79 corresponds to fusible links 60 and 61. Node 80 corresponds to fusible links 62 and 63.

Programmable decoder 16 has four programmable units 81, 82, 83 and 84 corresponding to quadrants 21, 22, 23 and 24, respectively. Programmable unit 81 comprises transistors 51, 66 and 67 and fusible links 56 and 57. Programmable unit 82 comprises transistors 52, 68 and 69 and fusible links 58 and 59. Programmable unit 83 comprises transistors 53, 70 and 71 and fusible links 60 and 61. Programmable unit 84 comprises transistors 54, 72 and 73 and fusible links 62 and 63.

The operation of memory portion 10 for example is of a 256K dynamic random access memory (DRAM) having 262,144 possible stored bits which are accessed by a multiplexed address comprised of a column address and a row address. Each address is comprised of nine address bits, A0, A1, A2, A3, A4, A5, A6, A7 and A8. Address bits A0–A7 (not shown) determine which four data bits from quadrants 21–24 are stored in data latches 26–29. In normal operation address bit A8 determines which of these four quadrants 21–24 provides the data bit which is subsequently provided as output signal DO. Address bit A8 has a column and a row component under the multiplexed address scheme which decoder 13 receives. The column component is address signal CA8. The row component is address signal RA8. The configuration of memory portion 10 is convenient for nibble mode operation. Nibble mode operations are described in U.S. Pat. No. 4,344,156, Eaton, Jr. et al, and in U.S. Pat. application No. 422,047, "Serial Data Mode Circuit For a Memory", Lewandowski et al, filed Sept. 23, 1982.

Decoder 13, in response to address signals CA8 and RA8, provides a logic high to the gate of one of transistors 31–34, causing that one transistor to turn on. When line 76 receives a column clock signal at a logic high, a logic high is then coupled to the data latch which corresponds to the transistor which received the logic high from decoder 13. The column clock signal is a conventionally generated signal which switches to a logic high after both the row and column address have been received and remains high for at least a long enough time to access one of latches 26–29. The data latch which receives the logic high then provides the data bit stored therein to latch 18 which in turn then provides this data bit as output signal DO. Transistors 41–44 are prevented from turning on by plurality of transistors 48. Each programmable unit 81–84 holds the gate of its corresponding transistor 41–44 at a logic low when signal CC is a logic high. Using programmable unit 81 as an example, one of transistors 66 and 67 will always be turned on when signal CC is a logic high because the gates are tied to signals which are complements of each other. When address signal RA8 is at a logic high, address signal $\overline{RA8}$ will be at a logic low, and vice versa except during a precharge period when both are a logic low. Although transistor 46 will build up a voltage on node 77, during the precharge period when signal P is a logic high, one of transistors 66 and 67 will pull node 77 to a logic low and thereby ensure that transistor 41 will not be on when signal CC switches to a logic high. Consequently, in normal operation programmable decoder 16 and plurality of transistors 17 do not effect the data bit selection process.

For providing a partial memory, fusible links 36–39 are opened by conventional means, for example, by a laser. This is done for a three-fourths, a one-half, or a one-fourth partial memory. This has the effect of decoupling decoder 13 from latches 26–29. Opening fusible links 36–39 opens the signal path between line 76 and plurality of latches 12 which was previously under the control of decoder 13. Decoder 13 consequently is capable of being decoupled from plurality of latches 12 so as to have no effect in the selection of which data bit is provided as output signal DO. With decoder 13 disabled, decoder 16 is then enabled.

For the case where memory array 11 is not completely functional but at least two quadrants are functional, programmable decoder 16 is programmed to select one of the two quadrants in response to signals RA8 and $\overline{RA8}$. This is achieved by opening a fusible link in each of the programmable units which correspond to the good quadrants. For example, assume quadrants 21 and 23 are good so that a 128K partial memory of 131,072 possible stored bits can be obtained with proper programming of decoder 16. Also assume that quadrant 21 is to be selected when signal RA8 is a logic high and quadrant 23 is to be selected when signal $\overline{RA8}$ is a logic high. Opening fusible link 56 and fusible link 61 will provide the desired programming. Fusible links 56 and 57 both correspond to quadrant 21. Fusible link 56 is chosen to be opened because it corresponds to signal RA8. When signal RA8 is a logic high, transistor 66 will still turn on but will not be able to pull node 77 to a logic low because fusible link 56 is open. Because signal $\overline{RA8}$ is a logic low, transistor 67 will be turned off. Consequently node 77 remains charged to a logic high which keeps transistor 41 turned on. Signal CC then switching to a logic high is coupled to latch 26 causing latch 26 to couple the data bit received from quadrant 21 to latch 18. For the case when signal RA8 remains at a logic low and signal $\overline{RA8}$ switches to a logic high, transistor 67 turns on to pull node 77 to a logic low which causes transistor 41 to turn off.

For the selection of quadrant 23 when signal $\overline{RA8}$ is a logic high, fusible link 61 is opened. Fusible links 61 and 60 both correspond to quadrant 23, but of these two only fusible link 61 corresponds to signal $\overline{RA8}$. With signal $\overline{RA8}$ at a logic high transistor 71 is turned on but with fusible link 61 opened node 79 is not pulled to a logic low by transistor 71. Transistor 70 is turned off because signal RA8 is a logic low. Consequently, node 79 remains charged to a logic high which keeps transistor 43 turned on. Signal CC then switches to a logic high causing latch 28 to provide the data bit received from quadrant 23 to latch 18. For the case when signal $\overline{RA8}$ remains at a logic low and signal RA8 switches to a logic high transistor 70 pulls node 79 to a logic low which causes transistor 43 to turn off. Accordingly, a data bit from quadrant 21 is selected when signal RA8 is a logic high and a data bit from quadrant 23 is selected when signal $\overline{RA8}$ is a logic high.

Any two quadrants can be selected in a like manner to form a partial memory of one half of the possible bits. The method of determining which two of fusible links 56–63 are to be opened is the same as indicated in the example described above. For a given quadrant there are two corresponding fusible links. Open the fusible link which corresponds to the particular quadrant and to the desired address signal, one of signals RA8 and $\overline{RA8}$.

If there is only one good quadrant or for some reason only a one fourth partial memory is desired, both fusible links corresponding to the good quadrant are opened. For example if only quadrant 22 is to be selected, fusible links 58 and 59 are opened. Nodes 77, 79 and 80 are still pulled to a logic low, but neither transistor 68 nor transistor 69 will be able to pull node 78 to a logic low due to fusible links 58 and 59 being opened. Consequently node 78 remains charged to a logic high in response to a precharge signal P regardless of the logic state of RA8 or $\overline{RA8}$ following the precharge period. Transistor 42 remains on to couple signal CC at a logic high to latch 27 causing latch 27 to provide the data bit received from quadrant 22 to latch 18. Consequently quadrant 22 is always selected for providing the data bit for the output data signal DO.

Figure 2:
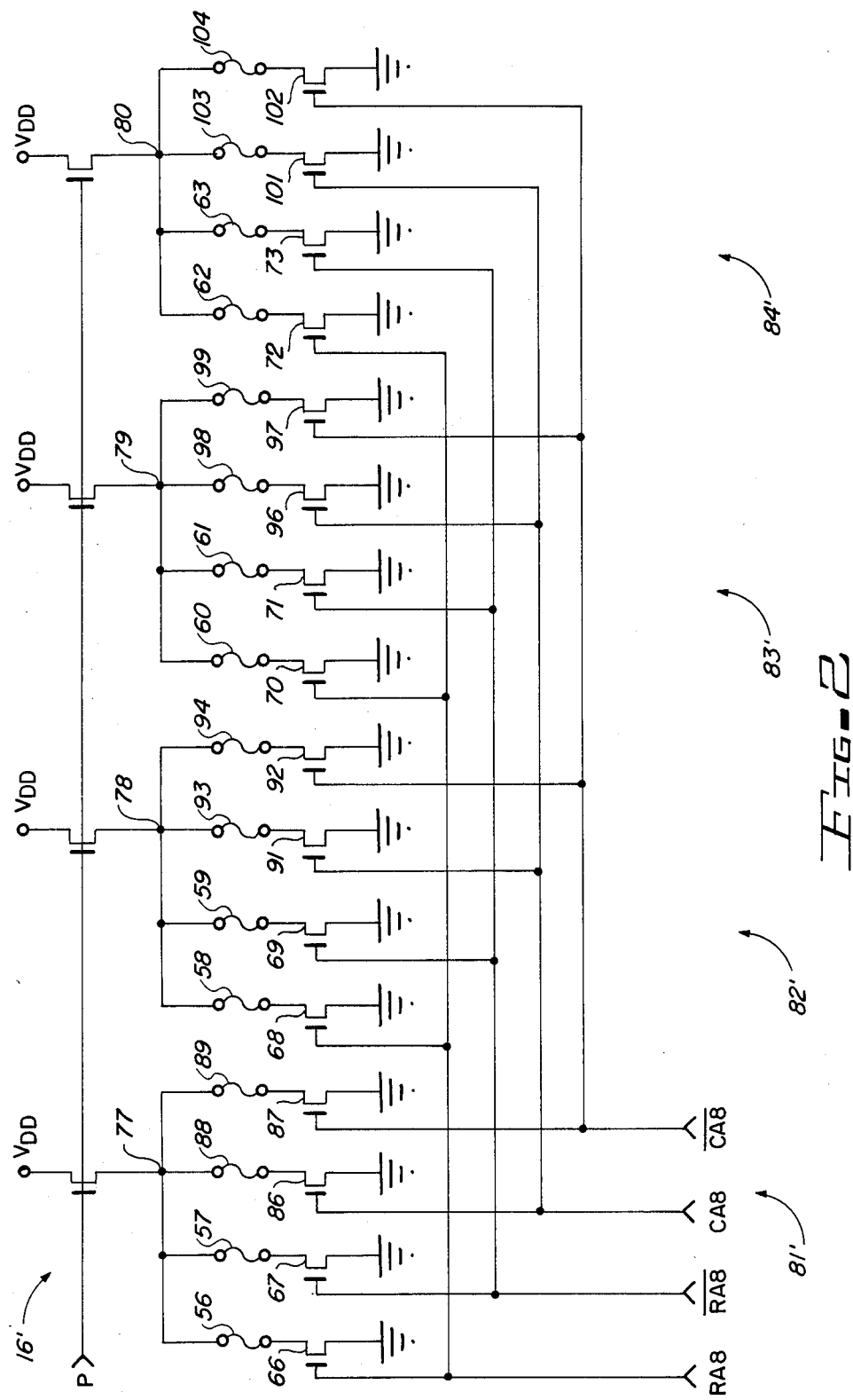

Shown in FIG. 2 is an alternate programmable decoder 16' which provides additional flexibility. Whereas programmable decoder 16 can be programmed to provide only either a one half or a one fourth partial memory, programmable decoder 16' can be programmed to provide a three-fourths, one-half, or one-fourth partial memory. The extra flexibility is achieved by providing two additional transistors and two fusible links to each programmable unit 81–84. Devices common to decoder 16 and 16' have the same number. In addition to precharge transistors 51–54, decoder 16' comprises programmable units 81', 82', 83' and 84'. Each programmable unit 81'–84' is the same as programmable units 81–84 but with the two additional transistors and fusible links.

Programmable unit 81' has additional transistors 86 and 87 and additional fusible links 88 and 89. Transistor 86 has a gate for receiving signal CA8, a source connected to ground, and a drain. Fusible link 88 is connected between node 77 and the drain of transistor 86. Transistor 87 has a gate for receiving signal $\overline{CA8}$, a source connected to ground, and a drain. Fusible link 89 is connected between node 77 and the drain of transistor 87.

Programmable unit 82' has additional transistors 91 and 92 and additional fusible links 93 and 94. Transistor 91 has a gate for receiving signal CA8, a source connected to ground, and a drain. Fusible link 93 is connected between node 78 and the drain of transistor 91. Transistor 92 has a gate for receiving signal $\overline{CA8}$, a source connected to ground, and a drain. Fusible link 94 is connected between node 78 and the drain of transistor 92.

Programmable unit 83' has additional transistors 96 and 97 and additional fusible links 98 and 99. Transistor 96 has a gate for receiving signal CA8, a source connected to ground, and a drain. Fusible link 98 is connected between node 79 and the drain of transistor 96. Transistor 97 has a gate for receiving signal $\overline{CA8}$, a source connected to ground, and a drain. Fusible link 99 is connected between node 79 and the drain of transistor 97.

Programmable unit 84' has additional transistors 101 and 102 and additional fusible links 103 and 104. Transistor 101 has a gate for receiving signal CA8, a source connected to ground, and a drain. Fusible link 103 is connected between node 80 and the drain of transistor 101. Transistor 102 has a gate for receiving signal $\overline{CA8}$, a source connected to ground, and a drain. Fusible link 104 is connected between node 80 and the drain of transistor 102.

Nodes 77–80 of decoder 16' of FIG. 2 are connected to the gates of transistors 41–44 as shown in FIG. 1 for decoder 16. Precharge transistors 51–54 are preferably transistors with a threshold voltage of 0.1 to 0.3 volt. The lower threshold voltage causes nodes 77–80 to be charged to a higher voltage. If natural transistors are not available, regular enhancement transistors can be used. Programmable units 81'–84' correspond to quadrants 21–24, respectively, analogously to decoder 16 of FIG. 1.

Without any fusible links being opened nodes 77–80 will be pulled to a logic low prior to signal CC switching to a logic high so that decoder 16' does not effect selection of a quadrant 21–24. To obtain a three fourths partial memory, the three programmable units of 81'–84' which correspond to three good quadrants of 21–24 are programmed. For example, if quadrants 21, 22 and 24 are good, then programmable units 81', 82' and 84' would be programmed. Each programmable unit 81'–84' can be programmed to respond to any one of the four combinations of column and row address of signals CA8 and RA8. This allows for providing a three fourths memory for any three good quadrants without having to change the address combination which selects these three quadrants. For example, the condition of RA8 and CA8 at a logic low can be chosen to be the particular combination which will not select a data bit, but yet any three good quadrants can be used for the other three logic combinations of signals RA8 and CA8.

If quadrant 21 is good, then programmable unit 81' will be programmed. If signals CA8 and RA8 both at a logic high is the desired combination for accessing quadrant 21, then fusible links 56 and 88 are opened. This results in node 77 remaining charged only when signals RA8 and CA8 are a logic high. With node 77 remaining charged, quadrant 21 is accessed. If either signal $\overline{RA8}$ or $\overline{CA8}$ switches to a logic high, node 77 will be discharged by transistor 67 or 87, preventing quadrant be discharged by transistor 67 or 87, preventing quadrant 21 from being accessed. For a given quadrant, there must be an associated unique combination of signals RA8 and CA8 to access it. The corresponding programmable unit is then programmed by opening the fusible links which correspond to the unique combination of signals RA8 and CA8. The fusible link which corresponds to signal CA8 at a logic low is the fusible link which corresponds to signal $\overline{CA8}$. For programmable unit 82' fusible link 94 corresponds to signal $\overline{CA8}$. Accordingly, if programmable unit 82' is programmed to access quadrant 22 in response to signal RA8 at a logic high and signal CA8 at a logic low, then fusible links 58 and 94 are opened. For the quadrant that is not functional, none of the fusible links of the corresponding programmable unit are opened.

For providing a one-half partial memory, only the two programmable units which correspond to the two quadrants which comprise the one-half partial memory are enabled. Because only one of signals RA8 and CA8 is required for a one of two selection, both fusible links which correspond to the unused signal are opened. As for the case described for FIG. 1 in which the row signal RA8 makes the one of two selection, the column signal CA8 is not relevant. Consequently both fusible links of the programmable unit to be enabled which correspond to signal CA8 are opened. The one of two selection by signal RA8 is then determined in the same manner as described for decoder 16 of FIG. 1. If for some reason it is desirable for accessing to also depend on signal CA8, then programming of the programmable unit is the same as for the three-fourths partial memory.

For a one-fourth partial memory, all of the fusible links of the programmable unit which corresponds to the good quadrant are opened. For example if quadrant 23 is the quadrant for providing a one-fourth partial memory, then fusible links 60, 61, 98 and 99 of programmable unit 83' are all opened. In such a case node 79 will remain charged so that quadrant 23 will always be selected. Consequently decoder 16', like decoder 16, provides the ability to select a one-half or one-fourth partial memory, but decoder 16' further provides the ability to select a three-fourths partial memory.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. In a memory having a plurality of substantially equal memory array portions in which each provides a data bit to a corresponding data latch in response to a first portion of an address and a first decoder for selecting any one of the data latches in response to a second portion of the address; a circuit for implementing a partial memory in which data is selected only from a predetermined subset of the plurality of memory array portions, comprising:
    a programmable second decoder, coupled to the data latches, for, when programmed, selecting only from among data latches which correspond to the predetermined subset of memory array portions in response to a sub-portion of the second portion of the address, and for being disabled when not programmed; and
    disabling means, coupled to the first decoder, for enabling or permanently disabling the first decoder, said first decoder being permanently disabled by the disabling means if said second decoder is programmed;
    whereby said memory provides data only from the predetermined subset of array portions when said second decoder is programmed.

2. The memory of claim 1 further comprising an output latch for receiving data from the selected data latch.

3. The memory of claim 2 wherein the second decoder is enabled by being programmed to select from a predetermined one half of the data latches.

4. The memory of claim 3 wherein the second decoder selects the selected data latch by providing a select signal thereto.

5. The memory of claim 2 wherein the plurality of array portions and plurality of data latches comprise four array portions and four data latches, respectively, and wherein the second decoder is capable of being programmed to any one of three operating modes, said three operating modes comprising:
    selecting one data latch from among three predetermined data latches;
    selecting one data latch between two predetermined data latches; and
    selecting from only one predetermined data latch.

6. A memory circuit, comprising:
    a memory array comprised of four quadrants;
    four data latches each for receiving and storing data from a corresponding quadrant in response to a first address signal;
    a programmable first decoder, coupled to the data latches, for selecting one of the four data latches in response to a second and a third address signal when unprogrammed, and for being permanently decoupled from the data latches when programmed; and
    a programmable second decoder, coupled to the four data latches, for, when programmed, selecting a data latch from between only two predetermined data latches in response to the first address signal, and for being disabled when not programmed, said second decoder being programmed if said first decoder is programmed.

7. The memory circuit of claim 6 further comprising an output latch having an input coupled to the four data latches and an output for providing a data output signal.

8. The memory circuit of claim 7 wherein each of the four data latches has a clock input for receiving an enable signal and for providing the data contained therein in response to receiving the enable signal to the output latch.

9. The memory circuit of claim 8 further comprising a plurality of coupling transistors for coupling the enable signal to the data latch selected by the second decoder in response to receiving an output from the second decoder.

10. The memory circuit of claim 9 wherein the second decoder comprises four programmable circuit units each of which corresponds to a quadrant wherein each programmable circuit unit can be programmed to select the corresponding quadrant in response to the second address signal.

11. The memory circuit of claim 10 wherein each programmable circuit unit comprises:
    a precharge transistor having a first current electrode coupled to a first power supply terminal, a control electrode coupled to a precharge signal, and a second current electrode coupled to an output node corresponding to the programmable circuit unit;
    a first decoder transistor having a control electrode for receiving the second address signal, a first current electrode coupled to a second current electrode of the precharge transistors, and a second current electrode coupled to a second power supply terminal;
    a first fusible link coupled between the output node and the second current electrode of the first decoder transistor;
    a second decoder transistor having a control electrode for receiving an address signal which is complementary to the second address signal, a first current electrode coupled to the second power supply terminal, and a second current electrode; and
    a second fusible link coupled between the output node and the second current electrode of the second decoder transistor.

* * * * *